United States Patent
Davis et al.

(10) Patent No.: US 7,619,365 B2
(45) Date of Patent: Nov. 17, 2009

(54) LOAD CONTROL DEVICE HAVING A VARIABLE DRIVE CIRCUIT

(75) Inventors: Gregory T. Davis, Allentown, PA (US);
Neil Orchowski, Philadelphia, PA (US);
Donald F. Hausman, Jr., Breinigsville, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 540 days.

(21) Appl. No.: 11/401,062

(22) Filed: Apr. 10, 2006

(65) Prior Publication Data

US 2007/0236152 A1    Oct. 11, 2007

(51) Int. Cl.
*H01J 13/32*      (2006.01)
*H05B 37/02*      (2006.01)
*H05B 37/00*      (2006.01)

(52) U.S. Cl. .................... 315/112; 315/209 R; 315/160
(58) Field of Classification Search ................. 315/307, 315/291, 112, 117, 118, 209 R, 246
See application file for complete search history.

(56) References Cited

U.S. PATENT DOCUMENTS

| | | | |
|---|---|---|---|
| 3,289,105 A | 11/1966 | Funfstuck | |
| 3,348,167 A | 10/1967 | Gauld | |
| 3,705,316 A | 12/1972 | Burrous et al. | |
| 3,898,516 A | 8/1975 | Nakasone | |
| 4,008,416 A | 2/1977 | Nakasone | |
| 4,139,798 A | 2/1979 | Hoover | |
| 4,163,181 A | 7/1979 | Farber | |
| 4,438,348 A | 3/1984 | Casper et al. | |
| 4,855,647 A | 8/1989 | Schaller et al. | |

(Continued)

FOREIGN PATENT DOCUMENTS

| JP | 06-203967 | 7/1994 |
|---|---|---|
| JP | 09-320764 | 12/1997 |

OTHER PUBLICATIONS

European Patent Office, International Search Report and Written Opinion, Sep. 17, 2007, 15 pages.

(Continued)

*Primary Examiner*—Douglas W Owens
*Assistant Examiner*—Minh Dieu A
(74) *Attorney, Agent, or Firm*—Mark E. Rose; Philip N. Smith

(57) ABSTRACT

A load control device for controlling the amount of power delivered to an electrical load from a source of AC power comprises a controllably conductive device and a variable gate drive circuit. The controllably conductive device is coupled in series electrical connection between the source and the electrical load to control the amount of power delivered to the load. The variable drive circuit is thermally coupled to the controllably conductive device and provides a continuously variable impedance in series with the control input of the controllably conductive device. The impedance of the variable drive circuit is operable to decrease as a temperature of the controllably conductive device increases and vice versa. Preferably, the variable drive circuit comprises an NTC thermistor. Accordingly, the switching times of the controllably conductive device, i.e., the times when the controllably conductive device is changing between the conductive and non-conductive states, remain constant, or alternatively decrease, as the temperature of the controllably conductive device increases.

16 Claims, 7 Drawing Sheets

U.S. PATENT DOCUMENTS

| | | |
|---|---|---|
| 5,089,751 A | 2/1992 | Wong et al. |
| 5,239,255 A | 8/1993 | Schanin et al. |
| 5,600,233 A | 2/1997 | Warren et al. |
| 5,625,519 A | 4/1997 | Atkins |
| 5,894,200 A | 4/1999 | Goodale, Jr. et al. |
| 5,909,108 A | 6/1999 | He et al. |
| 6,091,279 A | 7/2000 | Hamparian |
| 6,097,240 A | 8/2000 | Lapushin |
| 6,324,042 B1 | 11/2001 | Andrews |
| 6,400,102 B1* | 6/2002 | Ghanem ................. 315/291 |
| 6,707,273 B1 | 3/2004 | Gignac |
| 6,969,959 B2 | 11/2005 | Black et al. |
| 7,005,762 B2 | 2/2006 | Black et al. |
| 7,190,124 B2* | 3/2007 | Kumar et al. ............. 315/224 |
| 7,242,563 B2* | 7/2007 | Hua et al. ................ 361/100 |
| 7,342,764 B2* | 3/2008 | Black ...................... 361/160 |
| 7,358,627 B2* | 4/2008 | Black et al. .............. 307/125 |
| 2002/0021539 A1* | 2/2002 | Odaohhara et al. ......... 361/103 |
| 2006/0119186 A1 | 6/2006 | Black |
| 2006/0119187 A1 | 6/2006 | Newman, Jr. |
| 2006/0119292 A1 | 6/2006 | Black et al. |

OTHER PUBLICATIONS

Rosco Entertainment Technology, Capio Intelligent Power System Installation Guide, Jan. 2001, 30 pages.

Rosco Entertainment Technology, Capio Intelligent Power System User Guide, Jun. 2001, 44 pages.

Lightolier Controls, Capio Plus Dimmer Rack Product Specifications, 2005, 2 pages.

Lightolier Controls, Capio Plus Rack Control Module Product Specifications, 2005, 2 pages.

Lightolier Controls, Capio Plus IGBT Dimmer Racks Installation Guide, Dec. 16, 2004, 36 pages.

* cited by examiner

LOAD CONTROL DEVICE HAVING A VARIABLE DRIVE CIRCUIT

FIELD OF THE INVENTION

The present invention relates to drive circuits for controllably conductive devices in load control devices, and, more particularly, to temperature-sensitive drive circuits for semiconductor switches, such as field-effect transistors (FETs), in electric light dimmers.

BACKGROUND OF THE INVENTION

Standard load control devices, such as electric light dimmers, use one or more semiconductor switches, such as triacs or field-effect transistors (FETs), to control the current delivered to an electric load, for example, to control the intensity of a lighting load. The semiconductor switch is typically coupled in series between an alternating-current (AC) source and the lighting load. Using a phase-control dimming technique, the dimmer renders the semiconductor switch conductive for a portion of each half-cycle to provide power to the lighting load, and renders the semiconductor switch non-conductive for the other portion of the half-cycle to disconnect power from the load. In forward phase-control dimming, the semiconductor switch is conductive at the end of each half-cycle. Alternatively, in reverse-phase control dimming, the semiconductor switch is conductive at the beginning of each half-cycle.

FIG. 1 is a simplified schematic diagram of a prior art dimmer 10. The dimmer 10 has a hot connection H to an AC source 12 and a dimmed hot connection DH to a lighting load 14. The dimmer 10 comprises two FETs 16, 18 connected in anti-series connection between the AC source 12 and the lighting load 14 to control the amount of power delivered to the load. The FETs 16, 18 each have control inputs (or gates) that are coupled to a control circuit 20, such as a microcontroller. The control circuit 20 is operable to render each FET 16, 18 conductive (or non-conductive) by providing (or not providing) to the gate a voltage greater than the gate threshold voltage $V_{TH}$ of the FET. The gates of the FETs 16, 18 are often tied together to allow for a simplified operation of the FETs. The resulting operation allows for one FET 16 to block the flow of current to the load 14 during the positive half-cycles and the second FET 18 to block the flow of current to the load 14 during the negative half-cycles of the AC source.

A power supply 22 generates a direct-current (DC) voltage $V_{CC}$ to power the control circuit 20. A zero-cross circuit 24 provides an indication of the zero-crossings of the AC voltage of the AC source 12 to the control circuit 20. A zero-crossing is defined as the time at which the AC supply voltage transitions from positive to negative polarity, or from negative to positive polarity, at the beginning of each half-cycle. The zero-cross circuit 24 receives the AC voltage through a diode D1 in the positive half-cycles and through a diode D2 in the negative half-cycles. The control circuit 20 determines when to turn on or off the FETs 16, 18 each half-cycle by timing from each zero-crossing of the AC voltage.

A majority of the power dissipation (or "power loss") in the FETs 16, 18 of the dimmer 10 occurs during two main time periods of each half-cycle: a conduction time, $t_{CONDUCT}$, and a switching time, $t_{SWITCH}$. During the conduction time, a conduction loss, $P_{D-CONDUCT}$, occurs and is determined by the on-resistance, $R_{DS(on)}$, of the FETs and the load current, $I_{LOAD}$, through the FETs, i.e., $$P_{D\text{-}CONDUCT} = I_{LOAD}^2 \cdot R_{DS(on)}. \quad \text{(Equation 1)}$$

During the switching time $t_{SWITCH}$, one of the FETs 16, 18 will transition between the non-conductive and conductive states. FIG. 2 shows waveforms of the current $I_D$ through the FET, voltage $V_{DS}$ across the FET, and the instantaneous power dissipation $P_{D\text{-}INST}$ of the FET during the switching time $t_{SWITCH}$ when the dimmer 10 is operating with reverse-phase control dimming. As shown in FIG. 2, the FET will transition from a conductive state to a non-conductive state during the switching time. Accordingly, the current $I_D$ through the FET will decrease while the voltage $V_{DS}$ across the FET will increase during the switching time $t_{SWITCH}$. On the other hand, with forward-phase control dimming, the FET will transition from a non-conductive state to a conductive state during the switching time $t_{SWITCH}$, and thus, the current $I_D$ through the FET will increase and the voltage $V_{DS}$ across the FET will decrease.

A switching loss, $P_{D\text{-}SWITCH}$, occurs during the switching time and is dependent on the falling current $I_D$ and the rising voltage $V_{DS}$ (or the rising current $I_D$ and the falling voltage $V_{DS}$) during the switching time $t_{SWITCH}$. Thus, the total power $P_{D\text{-}TOTAL}$ dissipated by the FETs 16, 18 is dependent on the conduction loss during the conduction time and the switching loss during the switching time, i.e., $$P_{D\text{-}TOTAL} = (t_{CONDUCT} \cdot P_{D\text{-}CONDUCT} + t_{SWITCH} \cdot P_{D\text{-}SWITCH}) / T_{HALF\text{-}CYCLE}, \quad \text{(Equation 2)}$$

where $T_{HALF\text{-}CYCLE}$ is the period of a half-cycle. The overlap of the changing current $I_{DS}$ and the changing voltage $V_{DS}$ causes the instantaneous power dissipation $P_{D\text{-}INST}$ to peak up during the switching time $t_{SWITCH}$ as shown in FIG. 2. The switching loss $P_{D\text{-}SWITCH}$ is typically a significant portion of the total power dissipation $P_{D\text{-}TOTAL}$. Accordingly, a small increase in the switching time $t_{SWITCH}$ can cause a significant rise in the total power dissipation $P_{D\text{-}TOTAL}$ of the FETs.

Lighting dimmers are regulated by many industry standards, for example, electromagnetic interference (EMI) standards that limit the magnitude of the EMI noise that exists on the phase-control output of the dimmer. If the switching time $t_{SWITCH}$, i.e., the time when the semiconductor switch changes from the conductive state to the nonconductive state (and vice versa), is substantially short, the phase-control output will have many high-frequency components and the EMI noise will be increased. Therefore, many prior art dimmers have included a gate resistor $R_G$ in series with the gates of the FETs to slow down, i.e., increase, the rise and fall times of the current flowing through the FET during these switching times. For example, if the resistance of the gate resistor $R_G$ is 22 kΩ, the switching time $t_{SWITCH}$ may be approximately 62 μsec when the AC source voltage has a magnitude of 240 $V_{AC}$, the load current drawn by the lighting load has a magnitude of 10 A, and the ambient temperature is 25° C.

However, the increased switching times $t_{SWITCH}$ due to the gate resistor $R_G$ lead to an increased total power dissipation $P_{D\text{-}TOTAL}$ of the FET (as shown in Equation 2 above). Further, as the power dissipation $P_{D\text{-}TOTAL}$ of the FET increases and the temperature of the FET rises, the on-resistance $R_{DS(on)}$ will increase, which then leads to an increased conduction loss $P_{D\text{-}CONDUCT}$.

Compounding this thermal issue is the fact that the rising temperature causes the internal characteristics of the FET to change such that the threshold voltage $V_{TH}$ of the FET decreases. To transition the FETs 16, 18 from the conductive state to the non-conductive state, the control circuit 20 pulls the control inputs of the FETs towards circuit common.

Accordingly, a gate current $I_G$ will flow out of the gate and will have a magnitude of $$I_G = V_{TH}/R_G = C_M \cdot \Delta v/\Delta t, \quad \text{(Equation 3)}$$

where $C_M$ is the Miller capacitance of the FET, $\Delta t$ equals the switching time $t_{SWITCH}$, and $\Delta v$ is the changing voltage at the gate of the FET. Because of the rising voltage across the FET and the falling current through the FET, the voltage at the gate of the FET, i.e., $\Delta v$, will remain substantially constant at the threshold voltage $V_{TH}$ for the duration of the switching time $t_{SWITCH}$. Therefore, the switching time $t_{SWITCH}$ is dependent on the threshold voltage $V_{TH}$, since $$t_{SWITCH} = \Delta t = (R_G \cdot C_M \Delta v) V_{TH}. \quad \text{(Equation 4)}$$

Thus, as the temperature of the FET rises, the threshold voltage $V_{TH}$ of the FET decreases, the switching time $t_{SWITCH}$ increases (e.g., above 85 μsec) and the total power dissipation $P_{D\text{-}TOTAL}$ increases. This condition can lead to a thermal runaway situation, which causes undesirable device temperatures and, ultimately, failure of the FETs (for example, when the temperature of the FETs rises to 135° C.).

Some prior art dimmers decrease the conduction time of the FETs each half-cycle in order to decrease the conduction loss $P_{D\text{-}CONDUCT}$ as the temperature of the FETs increases. However, this causes the intensity level of the lighting load to change, which is undesirable. Thus, there exists a need for a gate drive circuit which allows for an increased switching time, and thus minimal EMI noise, when the FETs are operating at or near room temperature, and which further provides a decreased switching time when the temperature of the FETs has increased to prevent overheating of the FETs.

SUMMARY OF THE INVENTION

According to the present invention, a load control device, for controlling the amount of power delivered to an electrical load from an AC power source, comprises first and second controllably conductive devices, a control circuit, and first and second variable drive circuits. The first and second controllably conductive devices are adapted to conduct current from the source to the electrical load during a positive half-cycle and a negative half-cycle of the AC power source, respectively. The first and second controllably conductive devices have respective first and second control inputs for rendering the respective first and second controllably conductive devices conductive and non-conductive. The first variable drive circuit is coupled in series with the first control input of the first controllably conductive device to provide a first impedance in series with the first control input of the first controllably conductive device. The second variable drive circuit is coupled in series with the second control input of the second controllably conductive device to provide a second impedance in series with the second control input of the second controllably conductive device. The first impedance of the first variable drive circuit changes substantially only in response to a first temperature of the first controllably conductive device, and the second impedance of the second variable drive circuit changes substantially only in response to a second temperature of the second controllably conductive device.

According to another embodiment of the present invention, a load control device for controlling the amount of power delivered to an electrical load from a source of AC power comprises a plurality of controllably conductive devices and a variable drive circuit. The controllably conductive devices are coupled in series electrical connection between the source and the electrical load. Each controllably conductive device has a control input for rendering the respective controllably conductive device to be conductive or non-conductive. The plurality of controllably conductive devices include two semiconductor switches comprising a first FET and a second FET coupled in anti-series connection. The variable drive circuit is coupled to the control inputs of the controllably conductive devices to provide a continuously variable impedance in series with the control inputs of the controllably conductive devices. The variable drive circuits are thermally coupled to the controllably conductive devices, such that the variable drive circuit is operable to control the impedance in response to temperatures of the controllably conductive devices. The variable drive circuit decreases the impedance as the temperatures of the controllably conductive devices increase and increases the impedance as the temperatures of the controllably conductive devices decrease. The variable drive circuit comprises an NTC thermistor, a first resistor coupled in series electrical connection with the control inputs of the controllably conductive devices and in parallel electrical connection with the NTC thermistor, and a second resistor coupled in series electrical connection with the NTC thermistor. The series combination of the second resistor and the NTC thermistor is coupled in parallel electrical connection with the first resistor. The variable drive circuit is directly connected to both of the control inputs of the two semiconductor switches.

In addition, the present invention provides a drive circuit for a controllably conductive device in a load control device. The drive circuit comprises a first resistor coupled in series electrical connection with a control input of the controllably conductive device, and a thermally sensitive device coupled in parallel electrical connection with the first resistor. The thermally sensitive device is thermally coupled to the controllably conductive device such that the thermally sensitive device is operable to provide a variable impedance responsive to a temperature of the controllably conductive device. Preferably, the variable impedance decreases continuously as the temperature of the controllably conductive device increases, and increases continuously as the temperature of the controllably conductive device decreases. The drive circuit further comprises a second resistor coupled in series electrical connection with the thermally sensitive device.

The present invention further provides a method for controlling a controllably conductive device in a load control device. The method comprises the steps of providing a variable impedance in series electrical connection with a control input of the controllably conductive device, and changing the variable impedance in response to the temperature of the controllably conductive device. Preferably, the variable impedance changes continuously. More specifically, the variable impedance decreases continuously as the temperature of the controllably conductive device increases, and increases continuously as the temperature of the controllably conductive device decreases.

According to another aspect of the present invention, a method for controlling a controllably conductive device in a load control device comprises the step of controlling the controllably conductive device between a conductive state and a non-conductive state for a switching time responsive to a temperature of the controllably conductive device. Further, the switching time remains substantially constant as the temperature of the controllably conductive device increases.

Other features and advantages of the present invention will become apparent from the following description of the invention that refers to the accompanying drawings.

DETAILED DESCRIPTION OF THE INVENTION

Figure 1:
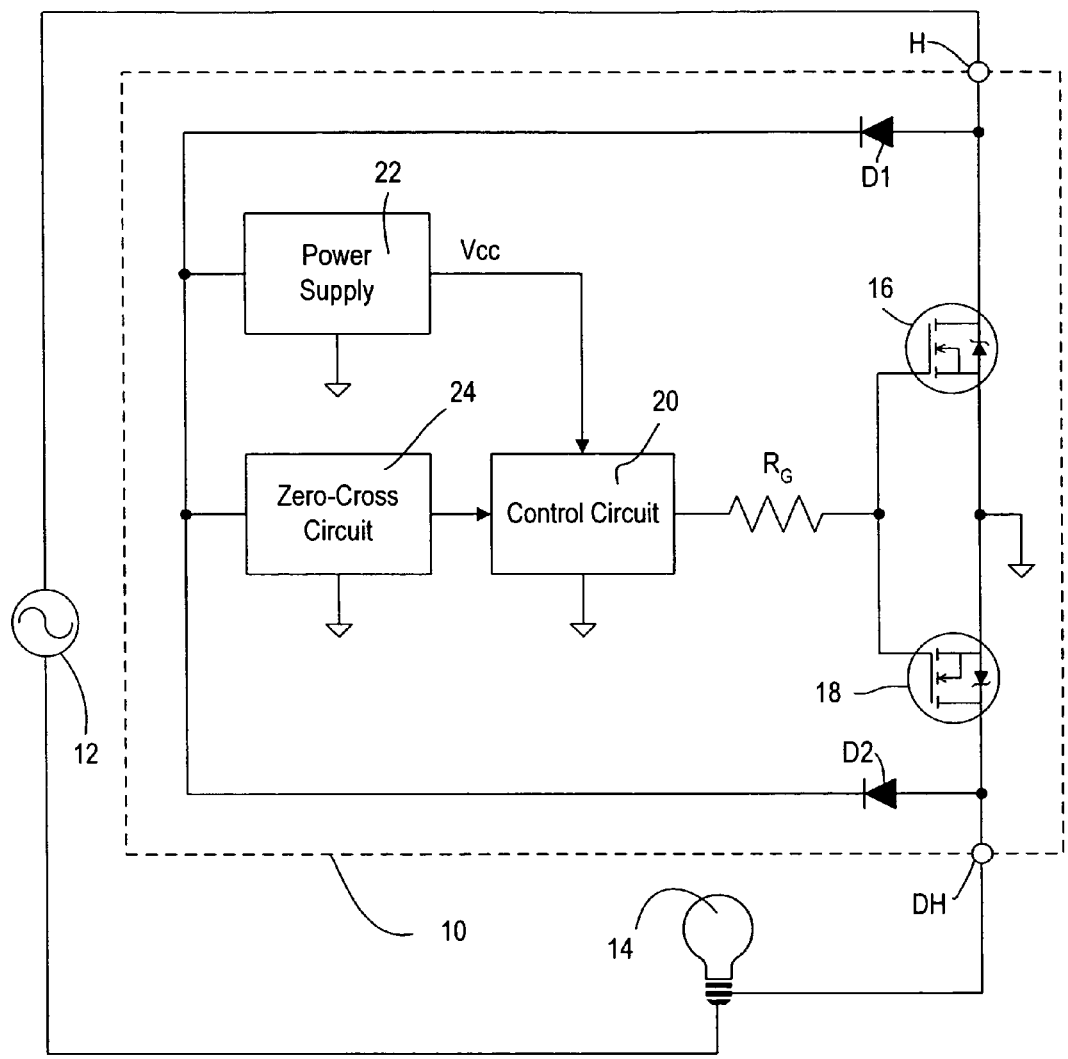
FIG. 1 is a simplified schematic diagram of a typical prior art lighting dimmer.
Figure 2:
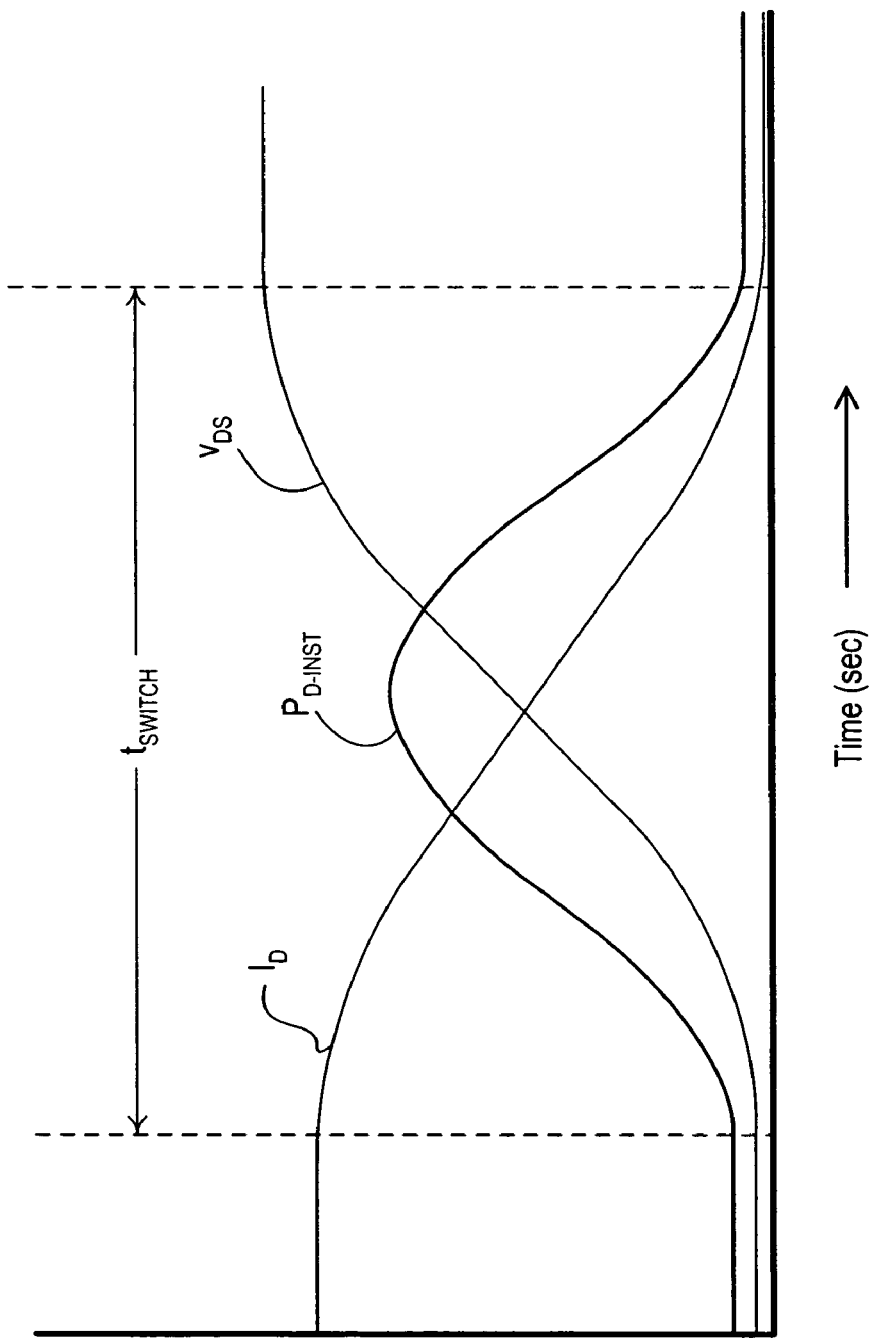
FIG. 2 is a plot of the current through, the voltage across, and the instantaneous power dissipation of a FET of the dimmer of FIG. 1.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

Figure 3:
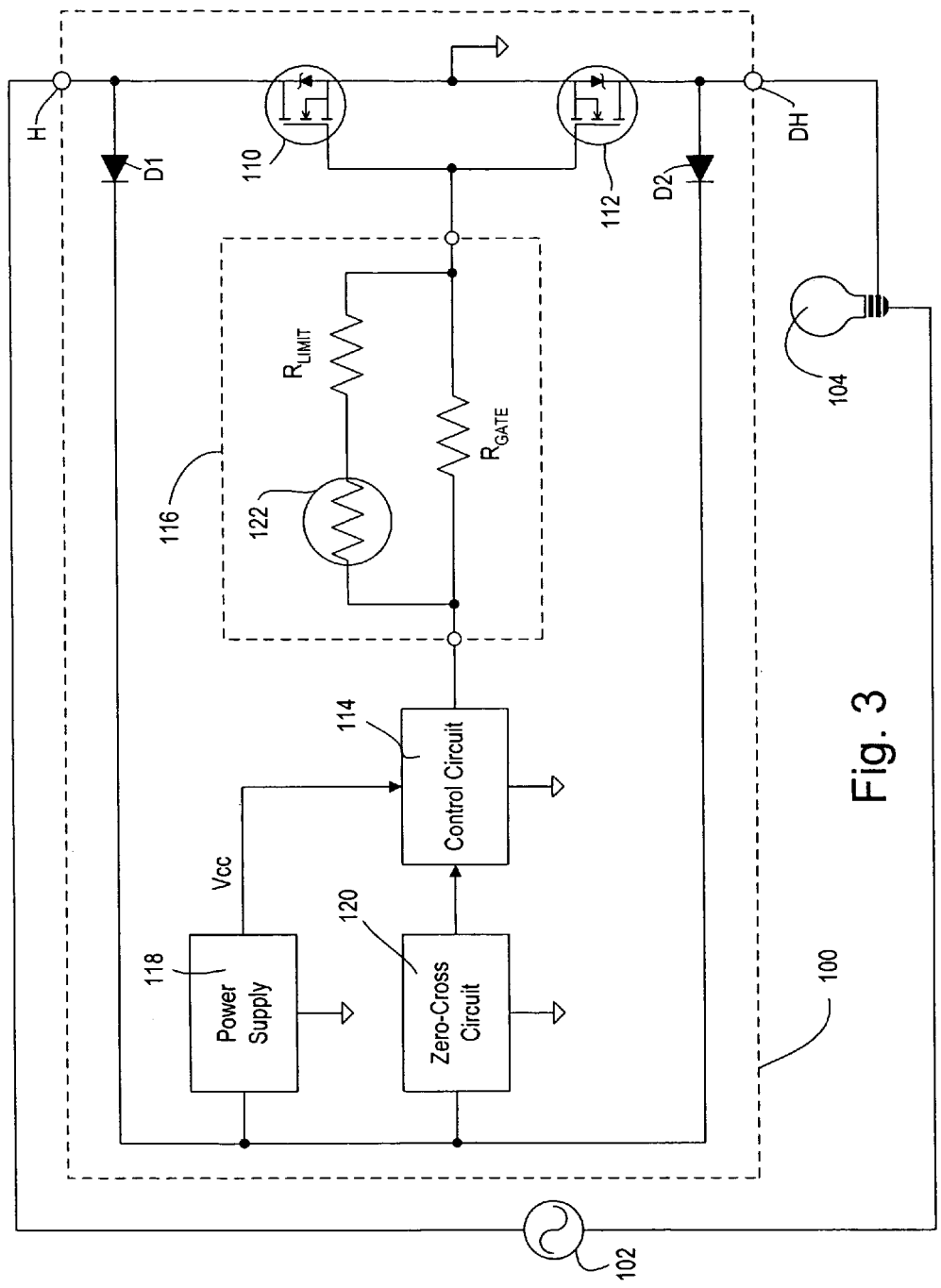
FIG. 3 is a simplified schematic diagram of a dimmer having a variable gate drive circuit according to the present invention.

FIG. 3 is a simplified schematic diagram of a dimmer 100 according to the present invention. The dimmer 100 has two connections: a hot connection H to an AC source 102 and a dimmed hot connection DH to a lighting load 104. To control the power delivered to the lighting load 104, a controllably conductive device, comprising, for example, two FETs 110, 112 in anti-series connection, is coupled between the hot terminal H and the dimmed hot terminal DH. Each FET 110, 112 has a control input, i.e., a gate, for rendering the FET non-conductive and conductive. The FET 110 conducts during the first, positive half-cycle of the AC waveform and the other FET 112 conducts during the second, negative half-cycle of the AC waveform. The controllably conductive device may also comprise a FET or an insulated gate bipolar transistor (IGBT) in a full-wave rectifier bridge, two IGBTs in anti-series connection, or any other suitable type of bidirectional semiconductor switch. Preferably, both FETs 110, 112 are part number IRFPS43N50K, which is manufactured by International Rectifier.

A control circuit 114 provides a control signal to the gates of the FETs 110, 112 through a variable drive circuit 116 to cause the FETs to become conductive or non-conductive. The control circuit 114 may comprise an analog circuit or any suitable processing device, such as a programmable logic device (PLD), a microcontroller, a microprocessor, or an application specific integrated circuit (ASIC).

A power supply 118 and a zero-cross circuit 120 are coupled to the AC source 102 through two diodes D1, D2. The power supply 118 generates a direct-current (DC) voltage $V_{CC}$ to power the control circuit 114. The zero-cross circuit 120 provides an indication of the zero-crossings of the AC voltage of the AC source 102 to the control circuit 114, which determines when to turn on or off the FETs 110, 112 each half-cycle by timing from each zero-crossing of the AC voltage. In other words, the switching of the FETs 110, 112 is synchronized to the zero-crossings of the AC source voltage.

The variable drive circuit 116 comprises an impedance, i.e., a negative-temperature coefficient (NTC) thermistor 122, in series with the gates of the FETs 110, 112. The variable drive circuit 116 further comprises a first resistor (i.e., a gate resistor $R_{GATE}$) in series with the gates of the FETs 110, 112 and in parallel with the NTC thermistor 122, and a second resistor (i.e., a limiting resistor $R_{LIMIT}$) in series with the NTC thermistor 122. The series combination of the NTC thermistor 122 and the limiting resistor $R_{LIMIT}$ is coupled in parallel with the gate resistor $R_{GATE}$.

An NTC thermistor is a thermally sensitive resistor that continuously decreases in resistance as the temperature of the device increases (and vice versa). The NTC thermistor 122 is preferably located in close proximity to the FETs 110, 112, such that the NTC thermistor is thermally coupled to the FETs, i.e., the resistance of the NTC thermistor is responsive to the temperature of the FETs. The variable drive circuit 116 has an equivalent resistance $R_{EQ}$ of $$R_{EQ} = [R_{GATE} \cdot (R_{NTC} + R_{LIMIT})]/(R_{GATE} + R_{NTC} + R_{LIMIT}), \quad \text{(Equation 5)}$$

where $R_{NTC}$ is the resistance of the NTC thermistor 122. The gate resistor $R_{GATE}$ and the limiting resistor $R_{LIMIT}$ preferably have resistances of 33 kΩ and 10 kΩ, respectively. The NTC thermistor 122 is preferably part number NCP15WB473J03RC, which is manufactured by Murata Manufacturing Co., Ltd and has a resistance of 47 kΩ at 25° C. Accordingly, the equivalent resistance $R_{EQ}$ of the variable drive circuit 116 is approximately 20.9 kΩ at 25° C., which causes the switching time of the FETs 110, 112 to be approximately 55 μsec.

As the temperatures of the FETs 110, 112 increase, the temperature of the NTC thermistor 122 also increases and thus the resistance of the NTC thermistor decreases. This causes the equivalent resistance $R_{EQ}$ of the variable drive circuit 116 to decrease, which in turn causes the rise and fall times, i.e., the switching times, of the FETs 110, 122 to decrease. Preferably, the temperatures of the FETs 110, 112 do not exceed 105° C. The limiting resistor $R_{LIMIT}$ prevents the equivalent resistance $R_{EQ}$ of the variable drive circuit 116 from falling too low, i.e., not lower than the resistance of the parallel combination of limiting resistor $R_{LIMIT}$ and the gate resistor $R_{GATE}$, and allowing excessively large currents to damage the components of the dimmer 100.

While the rise and fall times of the FETs 110, 112 increases as the temperature increases (as previously mentioned), the operation of the NTC thermistor 122 provides compensation by decreasing the switching times of the FETs. As a result, the switching times of the dimmer 100 remain substantially constant as the temperature changes. Preferably, the switching time changes less than 10% from the nominal switching time. For example, the switching time will remain between 49.5 μsec and 60.5 μsec across the operating temperature range of the FETs, assuming a nominal switching time of approximately 55 μsec at an ambient temperature of 25° C. The operating temperature range of the FETs varies from approximately 70° C. to 100° C. with an ambient temperature of approximately 25° C. to 40° C.

Alternatively, the components of the variable drive circuit 116 may be sized to overcompensate for increases in temperature, thus allowing the switching times of the dimmer 100 to decrease as temperature rises. When running at higher temperatures, the overcompensation permits the dimmer 100 to operate at even lower temperatures than if the switching times are held substantially constant across the operating temperature range. However, the equivalent resistance $R_{EQ}$ should not fall low enough to cause EMI problems, i.e., preferably not less than 9 kΩ-10 kΩ.

Figure 4:
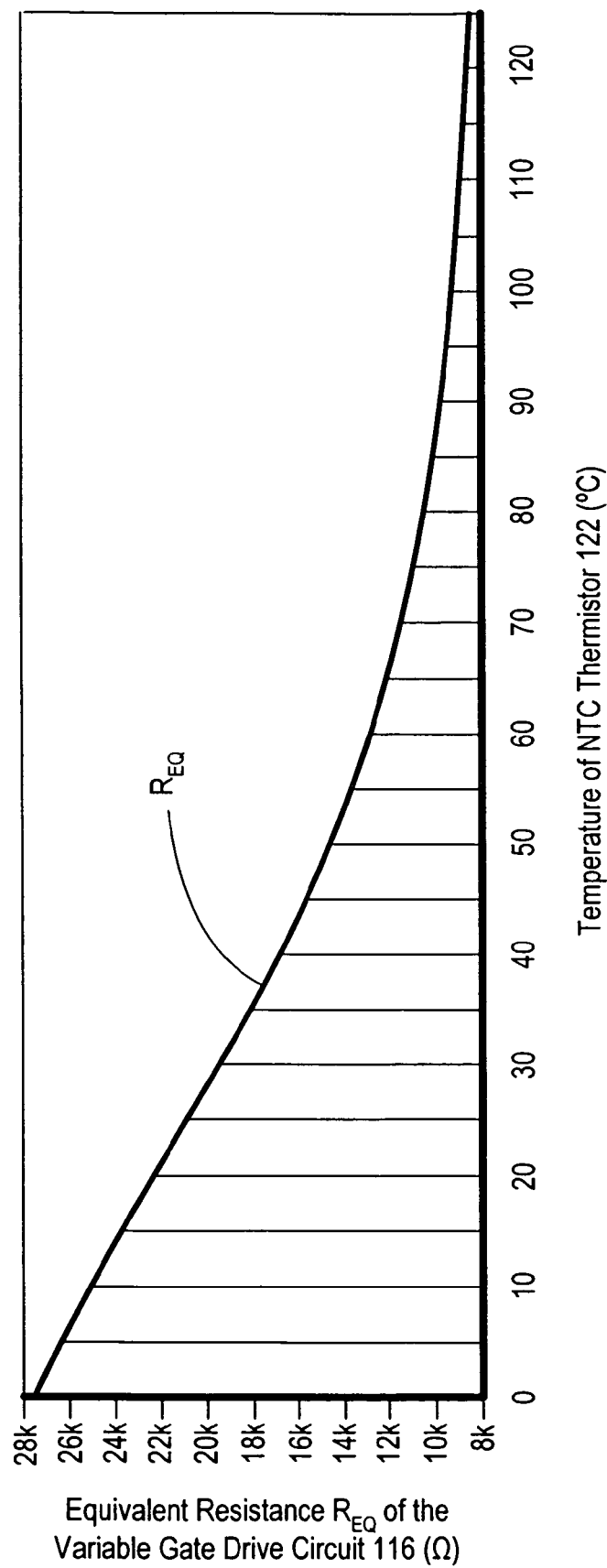
FIG. 4 shows a plot of an equivalent resistance of the variable gate drive circuit of FIG. 3 in response to the temperature of a thermistor of the variable gate drive circuit.

FIG. 4 shows a plot of the desired equivalent resistance $R_{EQ}$ of the variable drive circuit 116 in response to the temperature of the NTC thermistor 122 to decrease the switching times of the FETs 110, 112 as the temperatures of the FETs increase. Because of the nature of the NTC thermistor 122, the variable drive circuit 116 provides a continuously variable impedance in series with the gate of the FETs 110, 112.

While the values of the gate resistor $R_{GATE}$, the limiting resistor $R_{LIMIT}$, and the NTC thermistor 122 preferably have values as described above, other values may be used for these components. Further, even though the variable drive circuit 116 of the shown embodiment of the present invention comprises an NTC thermistor, the variable drive circuit could alternatively comprise another kind of thermally sensitive device, for example, a positive-temperature coefficient (PTC) thermistor coupled in a fashion to provide the same functionality as the variable drive circuit of the present invention.

Figure 5:
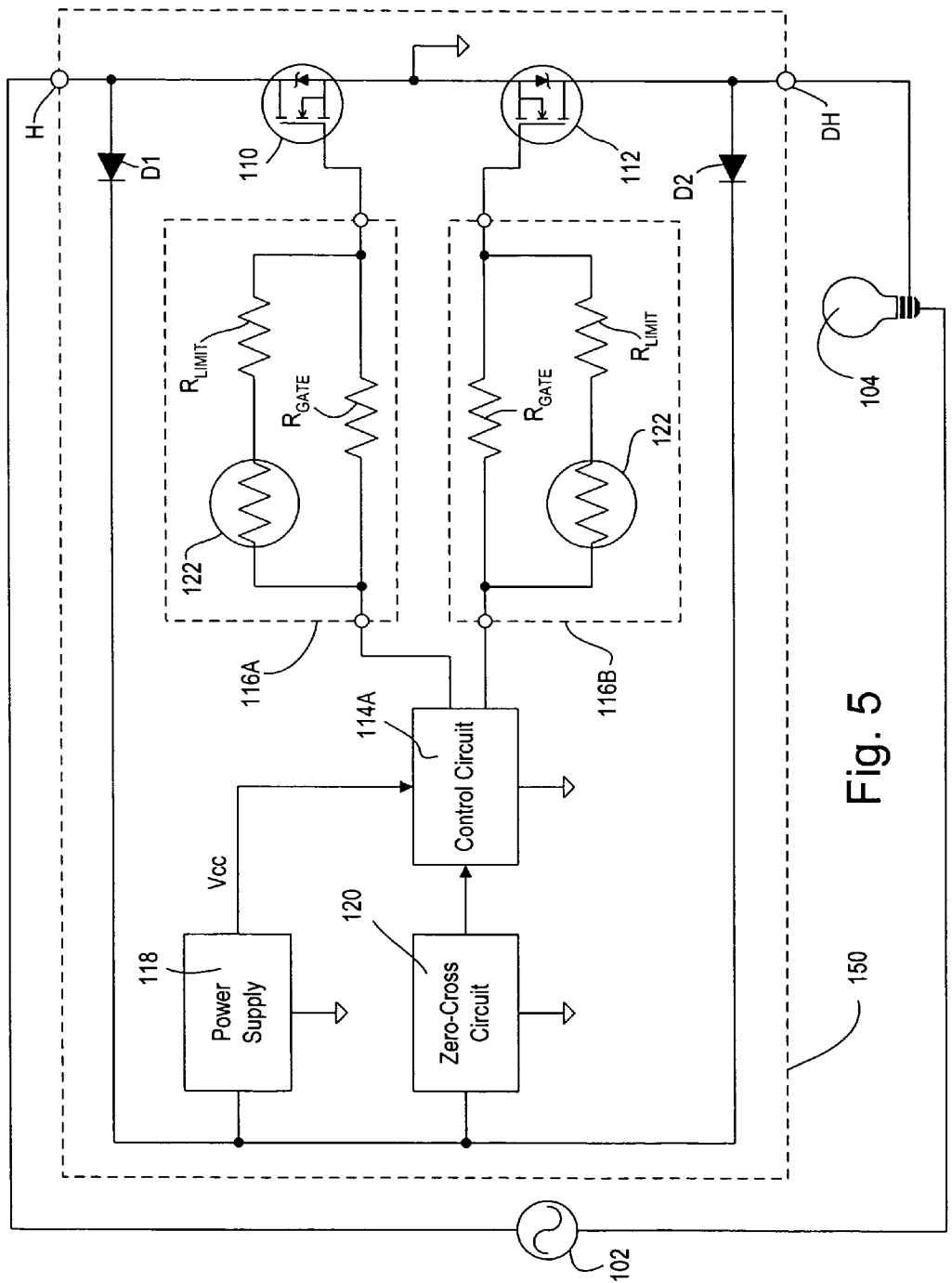
FIG. 5 is a simplified schematic diagram of a dimmer having two variable gate drive circuits according to a second embodiment of the present invention.

FIG. 5 is a simplified schematic diagram of a dimmer 150 having two variable gate drive circuits 116A, 116B according to a second embodiment of the present invention. A control circuit 114A is operable to individually control each of the FETs 110, 112. The first variable drive circuit 116A is provided in series between the control circuit 114A and the gate of the first FET 110 and is thermally coupled to the first FET 110. Similarly, the second variable gate drive circuit 116B is provided in series between the control circuit 114A and the gate of the second FET 112 and is thermally coupled to the second FET 112. Each of the variable gate drive circuits 116A, 116B operate in a similar fashion to the single variable gate drive circuit 116 of the dimmer 100 shown in FIG. 3 to provide a continuously variable impedance in series with the gates of each of the FETs 110, 112. Preferably, the first variable drive circuit 116A is only responsive to the temperature of the first FET 110, while the second variable drive circuit 116B is only responsive to the temperature of the second FET 112.

Figure 6:
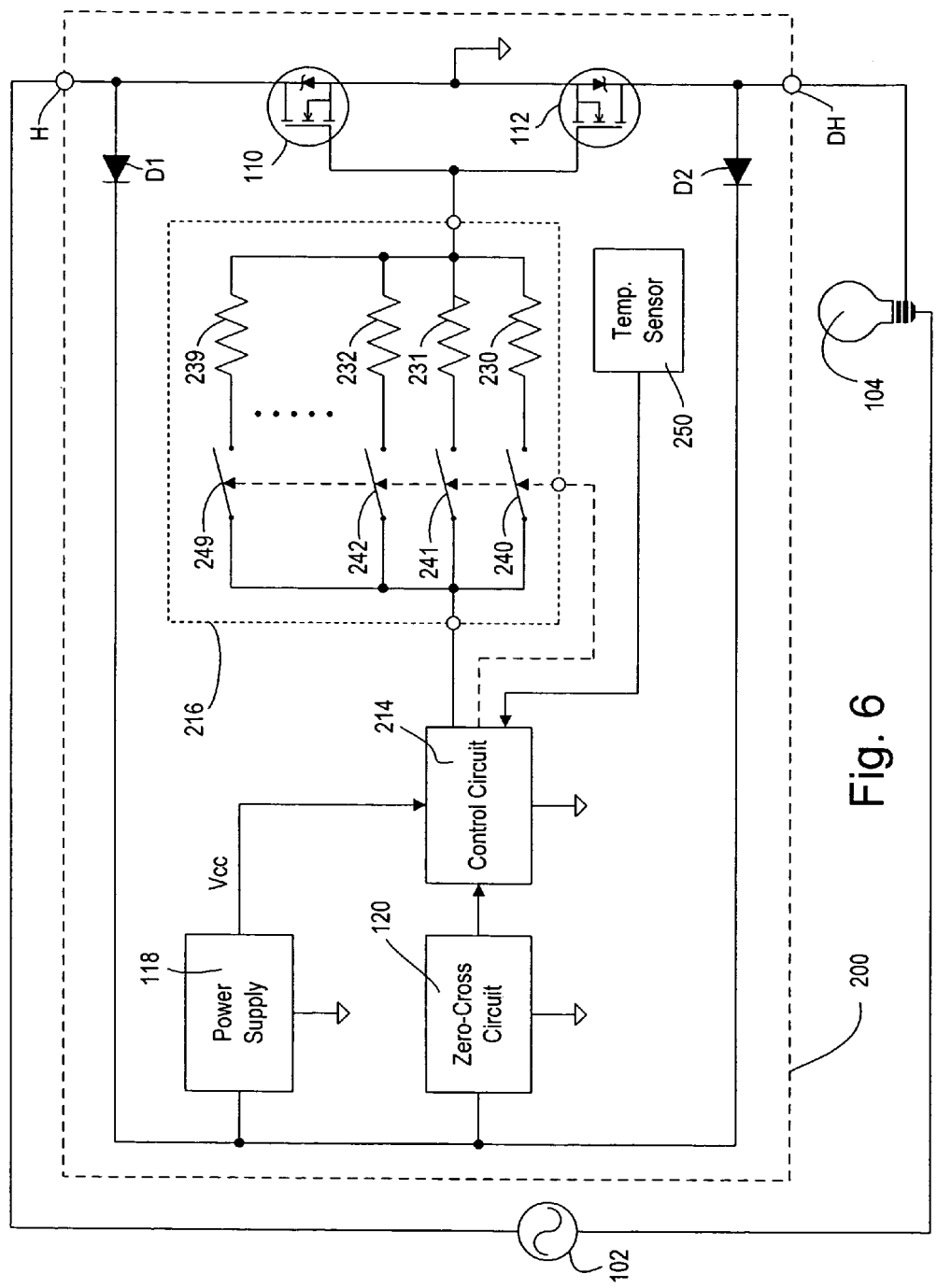
FIG. 6 is a simplified schematic diagram of a dimmer having a variable gate drive circuit according to a third embodiment of the present invention.

FIG. 6 is a simplified schematic diagram of a dimmer 200 according to a third embodiment of the present invention. The dimmer 200 includes a variable drive circuit 216 that is operable to provide a plurality of discrete steps of different impedances in series between a control circuit 214 and the gates of the FETs 110, 112. The variable drive circuit 216 includes a plurality of resistors 230-239 in parallel electrical connection. Each of the resistors 230-239 is coupled in series electrical connection with a controllably conductive device 240-249, respectively. The controllably conductive devices 240-249 may each comprise a FET or an IGBT in a full-wave rectifier bridge, two FETs or IGBTs in anti-series connection, or any other suitable type of bidirectional switch.

The controllably conductive devices 240-249 each have control inputs, which are coupled to the control circuit 214 such that the control circuit is operable to selectively couple the resistors 230-239 in series with the gates of the FETs 110, 112. A temperature sensor 250 is thermally coupled to the FETs 110, 112 and is operable to provide a control signal representative of the temperature of the FETs to the control circuit 214. The temperature sensor 250 may be any sort of thermally sensitive device that is operable to couple a signal representative of the temperatures of the FETs 110, 112 to the control circuit 214.

Accordingly, the control circuit is operable to selectively switch one or more of the resistors 230-239 in series with the gates of the FETs 110, 112, and thus control the switching times of the FETs, in response to the temperatures of the FETs. The dimmer 200 is operable to provide at least three separate discrete resistances in series with the gates of the FETs 110, 112. Preferably, the dimmer 200 provides ten discrete steps of resistance in series with the gates of the FETs 110, 112 in order to prevent perceptible flicker in the lighting load 104. As shown in FIG. 6, the dimmer 200 provides the separate resistors 230-239 in order to provide the ten discrete steps of resistance. Alternatively, the dimmer 200 could include a smaller number of resistors in order to provide the ten discrete steps of resistance, for example, by switching two or more resistors in parallel.

Figure 7:
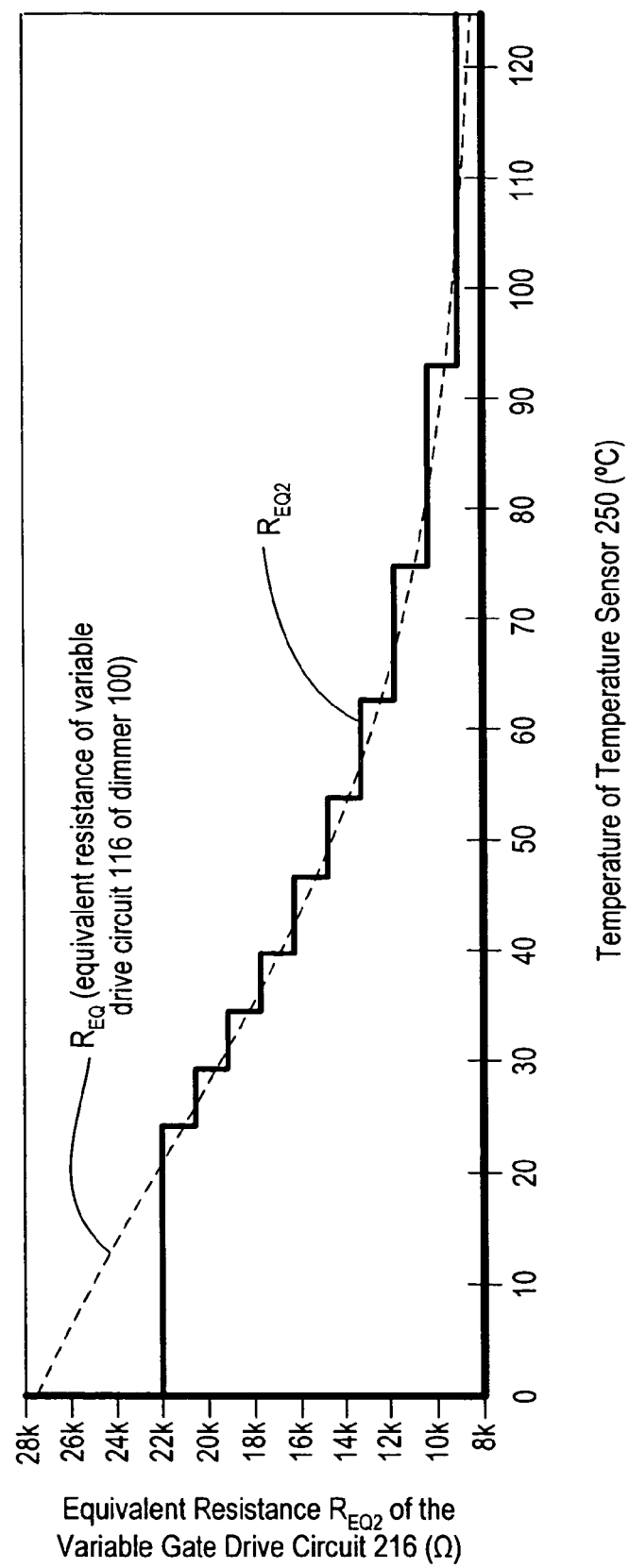
FIG. 7 shows a plot of an equivalent resistance of the variable drive circuit of FIG. 6 in response to the temperature of a temperature sensor of the dimmer.

FIG. 7 shows a plot of a desired equivalent resistance $R_{EQ2}$ of the variable drive circuit 216 in response to the control signal of the temperature sensor 250, i.e., the temperatures of the FETs 110, 112. The variable drive circuit 216 provides ten discrete resistances between a maximum resistance, e.g., approximately 22 kΩ, and a minimum resistance, e.g., approximately 9 kΩ. Alternatively, the variable drive circuit 216 may provide more than ten discrete resistances between the maximum resistance and the minimum resistance. Preferably, the resistors 230-239 are sized to provide a maximum step of 1.5 kΩ between two adjacent discrete resistances. Each step of resistance causes the switching time of the FETs 110, 112 to change by less than approximately 20 μsec. Preferably, the change between each discrete resistance step will produce a change of less than 10 μsec in the switching times of the FETs 110, 112.

Although the word "device" has been used to describe the elements of the dimmer of the present invention, it should be noted that each "device" described herein need not be fully contained in a single enclosure or structure. For example, the dimmer 100 of FIG. 3 may comprise a control circuit in a wall-mounted device with the variable gate drive circuit and the semiconductor switch mounted in a separate location, such as a power panel.

Additionally, the circuit diagrams shown in the figures and described in the text are an example of the invention and are not the only implementations possible. As appreciated by a person of ordinary skill in the art, component and circuit substitutions and alterations may be made to the present invention without limitation except as identified by the appended claims.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A load control device, for controlling the amount of power delivered to an electrical load from an AC power source, comprising:

a first controllably conductive device operable to conduct current from the source to the load during a positive half-cycle of the AC power source, the first controllably conductive device having a first control input to render the first controllably conductive device conductive and non-conductive;

a second controllably conductive device operable to conduct current from the source to the load during a negative half-cycle of the AC power source, the second controllably conductive device having a second control input to render the second controllably conductive device conductive and non-conductive;

a control circuit operable to independently render the first and second controllably conductive devices conductive and non-conductive;

a first variable drive circuit coupled in series electrical connection with the first control input of the first controllably conductive device to provide a first impedance in series with the first control input; and a second variable drive circuit coupled in series electrical connection with the second control input of the second controllably conductive device to provide a second impedance in series with the second control input;

wherein the first impedance of the first variable drive circuit is operable to change substantially only in response to a first temperature of the first controllably conductive device and the second impedance of the second variable drive circuit is operable to change substantially only in response to a second temperature of the second controllably conductive device.

2. The load control device of claim 1, wherein the first variable drive circuit is operable to decrease the first impedance as the first temperature of the first controllably conductive device increases and operable to increase as the first temperature of the first controllably conductive device decreases; and wherein the second variable drive circuit is operable to decrease the second impedance as the second temperature of the second controllably conductive device increases and operable to increase as the second temperature of the second controllably conductive device decreases.

3. The load control device of claim 2, wherein the first and second variable drive circuits are each operable to provide a continuously variable impedance in series with the control input of the respective controllably conductive device.

4. The load control device of claim 3, wherein the first and second variable drive circuits are thermally coupled to the first and second controllably conductive devices, respectively.

5. The load control device of claim 4, wherein each variable drive circuit comprises a thermistor.

6. The load control device of claim 5, wherein the thermistor of each variable gate drive circuit comprises an NTC thermistor.

7. The load control device of claim 6, wherein each variable drive circuit further comprises a first resistor coupled in series electrical connection with the control input of the controllably conductive device and in parallel electrical connection with the NTC thermistor.

8. The load control device of claim 7, wherein each variable drive circuit further comprises a second resistor coupled in series electrical connection with the NTC thermistor;

wherein the series combination of the second resistor and the NTC thermistor is coupled in parallel electrical connection with the first resistor.

9. The load control device of claim 3, wherein each controllably conductive device comprises a semiconductor switch.

10. The load control device of claim 9, wherein the first controllably conductive device comprises a first FET and the second controllably conductive device comprises a second FET, the first and second FETs coupled in anti-series connection.

11. The load control device of claim 10, wherein the first FET and the second FET are independently controlled.

12. The load control device of claim 9, wherein the first controllably conductive device comprises a first IGBT and the second controllably conductive device comprises a second IGBT, the first and second IGBTs coupled in anti-series connection.

13. The load control device of claim 2, wherein each variable drive circuit is operable to provide at least three discrete steps of impedance in series with the control input of the respective controllably conductive device.

14. The load control device of claim 13, wherein each variable drive circuit is operable to provide at least ten discrete steps of impedance in series with the control input of the respective controllably conductive device.

15. The load control device of claim 2, wherein the electrical load comprises a lighting load and each variable drive circuit is operable to provide a plurality of discrete steps of impedance in series with the control input of the respective controllably conductive device such that the number of discrete steps of impedance is great enough to prevent perceptible flicker in the lighting load as the impedance of each of the variable gate drive circuits is changed from one step to the next.

16. A load control device, for controlling the amount of power delivered to an electrical load from a source of AC power, comprising:

a plurality of controllably conductive devices adapted to be coupled in series electrical connection between the source and the electrical load, each controllably conductive device having a control input for rendering the respective controllably conductive device to be conductive or non-conductive, the plurality of controllably conductive devices including two semiconductor switches comprising a first FET and a second FET coupled in anti-series connection; and a variable drive circuit coupled to the control inputs of the controllably conductive devices to provide a continuously variable impedance in series with the control inputs of the controllably conductive devices, the variable drive circuit thermally coupled to the controllably conductive devices, such that the variable drive circuit is operable to control the impedance in response to temperatures of the controllably conductive devices, the variable drive circuit operable to decrease the impedance as the temperatures of the controllably conductive devices increase and operable to increase the impedance as the temperatures of the controllably conductive devices decrease;

wherein the variable drive circuit comprises an NTC thermistor, a first resistor coupled in series electrical connection with the control inputs of the controllably conductive devices and in parallel electrical connection with the NTC thermistor, and a second resistor coupled in series electrical connection with the NTC thermistor, the series combination of the second resistor and the NTC thermistor coupled in parallel electrical connection with the first resistor, the variable drive circuit directly connected to both of the control inputs of the two semiconductor switches.

* * * * *